United States Patent
Adusumilli et al.

(10) Patent No.: US 10,541,202 B2
(45) Date of Patent: *Jan. 21, 2020

(54) PROGRAMMABLE BURIED ANTIFUSE

(71) Applicant: International Business Machines Corporation, Armonk, NY (US)

(72) Inventors: Praneet Adusumilli, Somerset, NJ (US); Keith E. Fogel, Hopewell Junction, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,987

(22) Filed: Jul. 18, 2018

(65) Prior Publication Data

US 2018/0342457 A1    Nov. 29, 2018

Related U.S. Application Data

(63) Continuation of application No. 15/584,878, filed on May 2, 2017, now Pat. No. 10,056,329.

(51) Int. Cl.
*H01L 23/525* (2006.01)
*H01L 29/36* (2006.01)
*H01L 21/308* (2006.01)

(52) U.S. Cl.
CPC ........ *H01L 23/5252* (2013.01); *H01L 21/308* (2013.01); *H01L 29/36* (2013.01)

(58) Field of Classification Search
CPC .................................................. H01L 23/5252

(Continued)

(56) References Cited

U.S. PATENT DOCUMENTS 6,388,305 B1 * 5/2002 Bertin .................. H01L 21/763
257/513
6,740,957 B2 * 5/2004 Porter ................. H01L 23/5252
257/3

(Continued)

FOREIGN PATENT DOCUMENTS

CN    101740569 B    11/2011
CN    104183542 A    12/2014

(Continued)

OTHER PUBLICATIONS

List of IBM Patents or Patent Applications Treated as Related dated Jul. 18, 2018, 2 pages.

*Primary Examiner* — Steven H Loke
*Assistant Examiner* — Brandon C Fox
(74) *Attorney, Agent, or Firm* — Scully, Scott, Murphy & Presser, P.C.; L. Jeffrey Kelly, Esq.

(57) ABSTRACT

An antifuse is provided that is embedded in a semiconductor substrate. The antifuse has a large contact area, and a reduced breakdown voltage. After blowing the antifuse, the antifuse has a low resistance. The antifuse may have a single breakdown point or multiple breakdown points. The antifuse includes a metal or metal alloy structure that is separated from a doped semiconductor material portion of the semiconductor substrate by an antifuse dielectric material liner. The metal or metal alloy structure and the antifuse dielectric material liner have topmost surfaces that are coplanar with each other as well as being coplanar with a topmost surface of the semiconductor substrate.

12 Claims, 6 Drawing Sheets

(58) Field of Classification Search
USPC .......................................... 257/530; 438/131
See application file for complete search history.

(56) References Cited

U.S. PATENT DOCUMENTS

| | | | |
|---|---|---|---|
| 7,087,974 B2 | 8/2006 | Kuno et al. | |
| 7,982,285 B2 * | 7/2011 | Park | H01L 23/5252 257/209 |
| 8,008,669 B2 * | 8/2011 | Yang | H01L 23/5252 257/530 |
| 8,962,428 B2 | 2/2015 | Chen | |
| 9,379,206 B2 | 6/2016 | Bu | |
| 2007/0262415 A1 * | 11/2007 | Smith | H01L 21/82342 257/530 |
| 2010/0230781 A1 * | 9/2010 | Booth, Jr. | H01L 23/5252 257/530 |
| 2013/0015443 A1 * | 1/2013 | He | H01L 21/02532 257/57 |
| 2015/0028411 A1 * | 1/2015 | Lee | H01L 29/7827 257/330 |
| 2017/0148733 A1 | 5/2017 | Cheng et al. | |
| 2017/0301680 A1 | 10/2017 | Adusumilli et al. | |

FOREIGN PATENT DOCUMENTS

| | | |
|---|---|---|
| CN | 104183543 A | 12/2014 |
| JP | 574947 A | 3/1993 |
| JP | 590412 A | 4/1993 |
| KR | 1020130005760 A | 1/2013 |

\* cited by examiner

PROGRAMMABLE BURIED ANTIFUSE

BACKGROUND

The present application relates to a semiconductor structure and a method of forming the same. More particularly, the present application relates to a semiconductor structure including an antifuse that is embedded in a semiconductor substrate, and a method of forming such a semiconductor structure.

An antifuse is an electrical device that performs the opposite function to a fuse. Whereas a fuse starts with a low resistance and is designed to permanently break an electrically conductive path (typically when the current through the path exceeds a specified limit), an antifuse starts with a high resistance and is designed to permanently create an electrically conductive path (typically when the voltage across the antifuse exceeds a certain level).

On-chip antifuses are essential elements for semiconductor chips containing FinFETs or vertical transistors and are used in a variety of applications such as system-on-chips. In such technology, conventional antifuses are planar and are formed on, or above, a surface of a semiconductor substrate. As such, conventional antifuses require space for their fabrication which is limited for tightly integrated FinFET or vertical transistor structures.

There is thus a need for providing a semiconductor structure including an antifuse that can be implemented in semiconductor chips containing FinFETs or vertical transistors in which the antifuse takes up less space than a conventional planar antifuse that is formed upon, or above, a semiconductor substrate.

SUMMARY

An antifuse is provided that is embedded in a semiconductor substrate; such an antifuse may be referred to herein as a buried antifuse. The antifuse has a large contact area, and a reduced breakdown voltage. After blowing the antifuse, the antifuse has a low resistance. The antifuse may have a single breakdown point or multiple breakdown points. The antifuse includes a metal or metal alloy structure that is separated from a doped semiconductor material portion of the semiconductor substrate by an antifuse dielectric material liner. The metal or metal alloy structure and the antifuse dielectric material liner have topmost surfaces that are coplanar with each other as well as being coplanar with a topmost surface of the semiconductor substrate.

In one aspect of the present application, a semiconductor structure is provided. In one embodiment, the semiconductor structure includes an antifuse embedded in a semiconductor substrate. The antifuse includes a metal or metal alloy structure that is present in a doped semiconductor material portion of the semiconductor substrate. An antifuse dielectric material liner is present between the doped semiconductor material portion and the metal or metal alloy structure. The metal or metal alloy structure and the antifuse dielectric material liner have topmost surfaces that are coplanar with each other as well as being coplanar with a topmost surface of the semiconductor substrate.

In another aspect of the present application, a method of forming a semiconductor structure containing a buried antifuse is provided. In one embodiment, the method may include providing an opening having non-vertical sidewalls within a doped semiconductor material portion of a semiconductor substrate. Next, an antifuse dielectric material liner and a metal or metal alloy structure are formed in the opening.

In another embodiment, the method may include providing a recessed opening having vertical sidewalls and a bottom wall within a doped semiconductor material portion of a semiconductor substrate. Next, an antifuse dielectric material liner and a metal or metal alloy structure are formed in the recessed opening.

DETAILED DESCRIPTION

Figure 1:
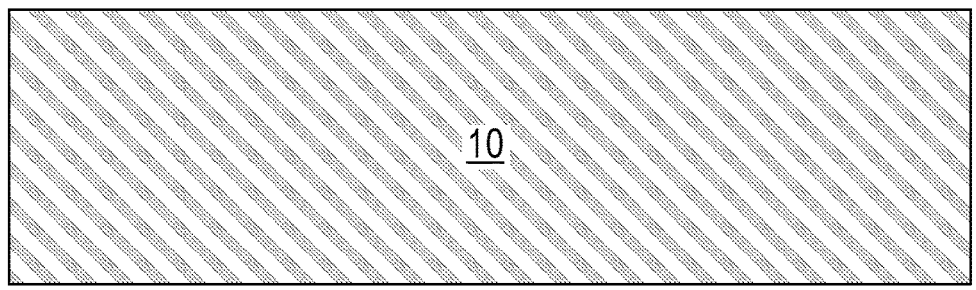
FIG. 1 is a cross sectional view of a first exemplary semiconductor structure during an early stage of fabrication and including a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a first exemplary semiconductor structure during an early stage of fabrication and including a semiconductor substrate 10 that can be employed in accordance with an embodiment of the present application. At this point of the present application, the semiconductor substrate 10 is typically an intrinsic (i.e., non-doped) semiconductor material.

The semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

Figure 2:
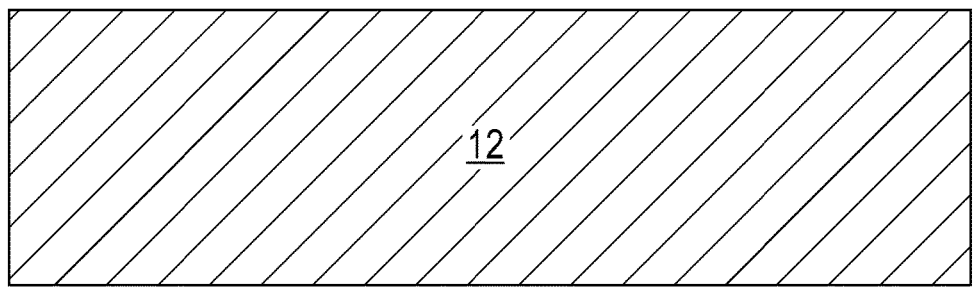
FIG. 2 is a cross sectional view of the first exemplary semiconductor structure of FIG. 1 after introducing dopants (p-type or n-type) into at least an upper semiconductor material portion of the semiconductor substrate.

Referring now to FIG. 2, there is illustrated the first exemplary semiconductor structure of FIG. 1 after introducing dopants (p-type or n-type) into at least an upper semiconductor material portion of the semiconductor substrate 10 to provide a doped semiconductor substrate 12. The term "doped semiconductor substrate" is used throughout the present application to denote a semiconductor substrate that contains at least an upper doped semiconductor material portion. In one embodiment of the present application, the dopants can be introduced into an entirety of the semiconductor substrate 10. In yet another embodiment, the dopants can be introduced into only an upper portion of the semiconductor substrate 10 in which the antifuse of the present application will be subsequently formed.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, and when the semiconductor substrate 10 is composed of silicon, an n-type dopant is introduced into the semiconductor substrate 10.

The dopants can be introduced into at least the upper semiconductor material portion of the semiconductor substrate 10 utilizing techniques well known in the art including, but not limited to, ion implantation, gas phase doping, or doping by out-diffusing a dopant from a dopant source material (not shown).

In one embodiment, the doped semiconductor substrate 12 may have a uniform distribution of dopants present therein. In yet another embodiment, the doped semiconductor substrate 12 may have a gradient distribution of dopants that may increase or decrease from the topmost surface of the doped semiconductor substrate 12. In the present application, the doped semiconductor substrate 12 may have a dopant concentration of from $1\times10^{20}$ atoms/cm$^3$ to $1\times10^{21}$ atoms/cm$^3$. Such a doping concentration is sufficient to provide one conductive region of the antifuse of the present application.

Figure 3:
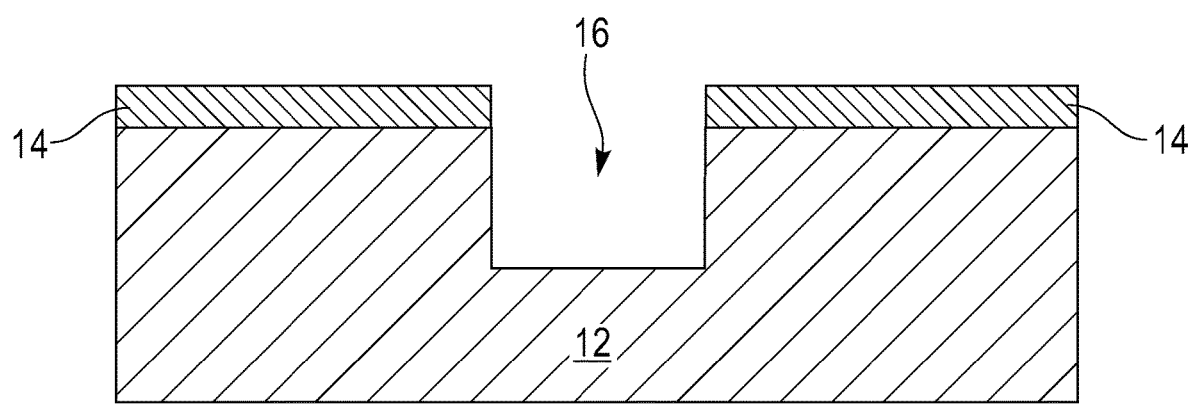
FIG. 3 is a cross sectional view of the first exemplary semiconductor structure of FIG. 2 after forming a hard mask layer on a topmost surface of the doped semiconductor substrate and thereafter forming an recessed opening entirely through the hard mask layer and into the upper doped semiconductor material portion of the semiconductor substrate.

Referring now to FIG. 3, there is illustrated the first exemplary semiconductor structure of FIG. 2 after forming a hard mask layer (not shown) on a topmost surface of the doped semiconductor substrate 12 and thereafter forming a recessed opening 16 entirely through the hard mask layer and into the upper portion of the doped semiconductor substrate 12; the recessed opening 16 provides a region in which components of the antifuse of the present application will be subsequently formed. Although the present application describes and illustrates the formation of a single recessed opening 16, a plurality of spaced apart recessed openings can be formed into the doped semiconductor substrate 12.

The hard mask layer (not shown) that can be used in the present application includes any dielectric hard mask material such as, for example, silicon dioxide, silicon nitride and/or silicon oxynitride. In one example, silicon nitride is employed as the dielectric hard mask material. The hard mask layer may be formed utilizing a deposition process such as, for example, chemical vapor deposition (CVD) or plasma enhanced chemical vapor deposition (PECVD). In some embodiments, the hard mask layer may be formed by a thermal growth process such as, for example, thermal oxidation and/or thermal nitridation. In yet other embodiments, the hard mask layer may be formed utilizing a combination of, and in any order, a deposition process and a thermal growth process. The hard mask layer is a continuous layer (without any breaks or gaps) whose thickness may be from 20 nm to 100 nm. Other thicknesses that are lesser than, or greater than the aforementioned thicknesses values may also be employed as the thickness of the hard mask layer.

After providing the hard mask layer, the recessed opening 16 can be formed utilizing a patterning process. In one embodiment, the patterning process used to providing recessed opening 16 may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., patterned transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer. In other embodiments, the patterned photoresist is removed from the structure after the pattern has been transferred into both the hard mask layer and the doped semiconductor substrate 12. In either embodiment, the patterned photoresist may be removed utilizing a conventional photoresist stripping process such as, for example, ashing. The remaining portion of the hard mask layer that is present on the doped semiconductor substrate 12 after etching may be referred to herein as a hard mask 14.

The recessed opening 16 has a bottom surface that physically exposes a sub-surface of the doped semiconductor substrate 12; in the present application doped semiconductor material defines the vertical sidewalls and the bottom wall of the recessed opening 16; the bottom wall is horizontal relative to the vertical sidewalls. By "sub-surface" it is meant a surface of a material that is located between a topmost surface of the material and a bottommost surface of the material. In one embodiment, the recessed opening 16 is formed to a depth, as measured from the topmost surface of the doped semiconductor substrate 12 inward, of from 50 nm to 500 nm. The recessed opening 16 has a pair of opposing vertical sidewalls that physically exposes sidewall surfaces of the doped semiconductor substrate 12. As used herein, a surface is "vertical" if there exists a vertical plane from which the surface does not deviate by more than three times the root mean square roughness of the surface. The recessed opening 16 may have a width from 50 nm to 500 nm. Other widths besides those specifically mentioned herein may be used in the present application as the width of the recessed opening 16. The length of the recessed opening 16 may be lesser than, greater than, or equal to the width. The recessed opening 16 that is formed at this point of the present application is square or rectangular in shape.

Figure 4:
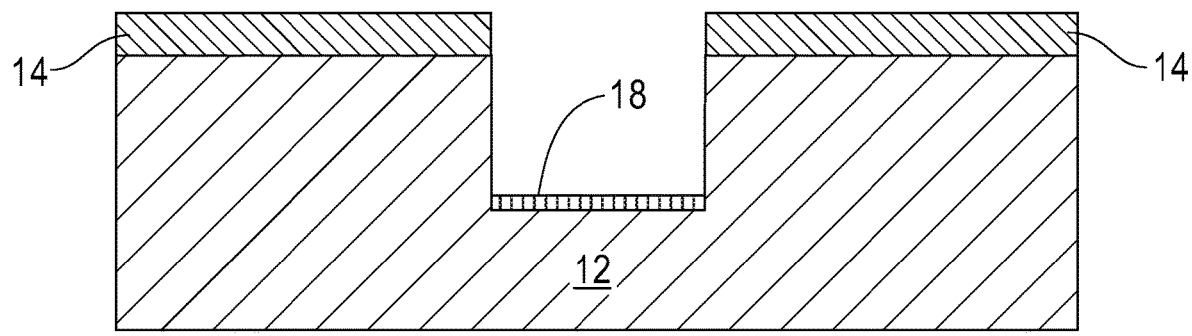
FIG. 4 is a cross sectional view of the first exemplary semiconductor structure of FIG. 3 after forming an etch stop region at the bottom of the recessed opening and within the doped semiconductor substrate.

Referring now to FIG. 4, there is illustrated the first exemplary semiconductor structure of FIG. 3 after forming an etch stop region 18 at the bottom of the recessed opening 16 and within a physically exposed portion of the doped semiconductor substrate 12. In the illustrated embodiment, the etch stop region 18 extends across the entirety of the bottommost surface (e.g., bottom wall) of the recessed opening 16.

The etch stop region 18 may be formed by implanting a second dopant ion into the physically exposed doped semiconductor material of the doped semiconductor substrate 12 such that an etch stop region 18 is formed that has a higher etch resistance than the remaining doped semiconductor material of the doped semiconductor substrate 12. In one embodiment and when silicon is employed as the semiconductor material of the doped semiconductor substrate 12, boron can be ion implanted into the physically exposed doped semiconductor material of the doped semiconductor substrate 12 such that a boron doped silicon etch stop region is formed.

The etch stop region 18 may have a second dopant concentration of from $1 \times 10^{18}$ atoms/cm$^3$ to $1 \times 10^{20}$ atoms/cm$^3$; other second dopant concentrations are conceivable as long as the etch stop region 18 is formed that has a higher etch resistance than the remaining doped semiconductor material of the doped semiconductor substrate 12.

Figure 5:
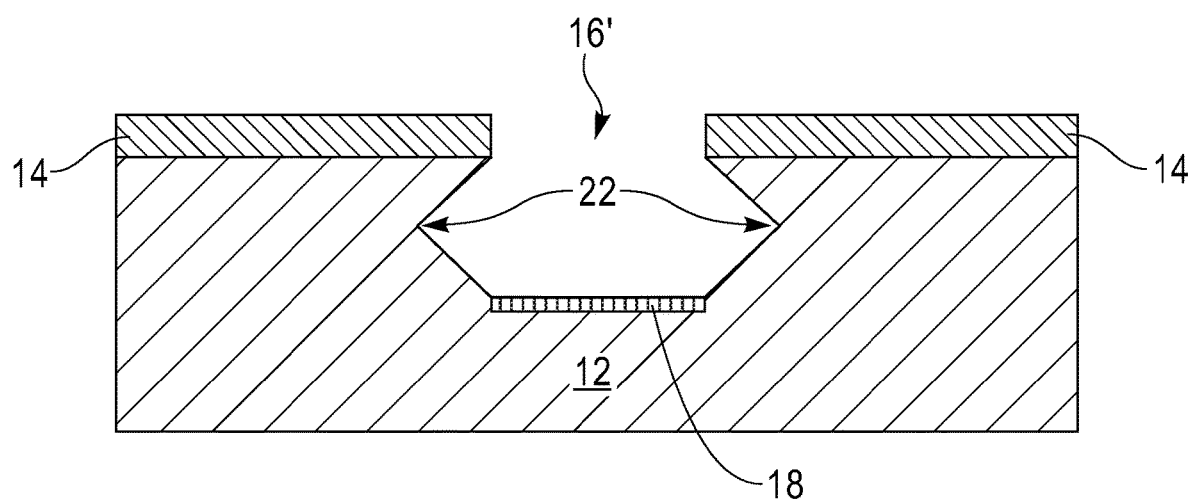
FIG. 5 is a cross sectional view of the first exemplary semiconductor structure of FIG. 4 after performing a crystallographic etch.

Referring now to FIG. 5, there is illustrated the first exemplary semiconductor structure of FIG. 4 after performing a crystallographic etch which etches the physically exposed surfaces of the doped semiconductor substrate 12 selective to the etch stop region 18. As is shown, each etched sidewall surface of the doped semiconductor substrate 12 in the recessed opening 16 have a faceted sidewall surface 22. Thus, and after performing the crystallographic etch, the crystallographic etched and recessed opening 16' has faceted sidewall surfaces instead of vertical sidewall surfaces. The term "faceted sidewall surface" is used in the present application to denote a sidewall surface that is non-vertical relative to a horizontal plane and is jagged. In one example, each faceted sidewall surface 22 may be a (111) bound silicon surface. In such an embodiment, a sigma shaped region, as is shown in FIG. 5, can be formed between opposing faceted sidewall surfaces 22 within crystallographic etched and recessed opening 16'. In one example and when a silicon substrate is employed, the crystallographic etch that can be employed may include a sigma etch that includes tetramethylammonium hydroxide (TMAH) as the wet etchant.

Figure 6:
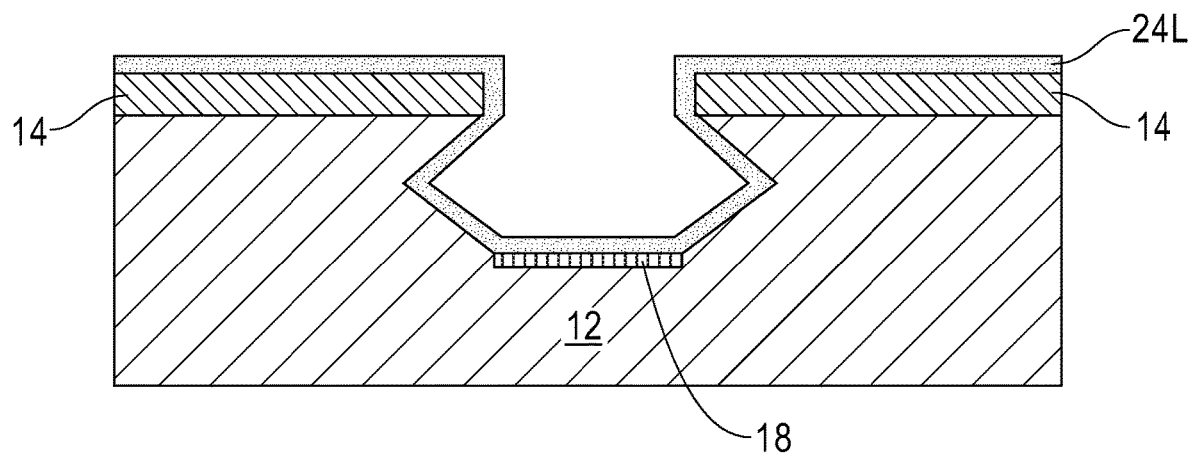
FIG. 6 is a cross sectional view of the first exemplary semiconductor structure of FIG. 5 after forming an antifuse dielectric material layer having a dielectric constant that is greater than silicon dioxide.

Referring now to FIG. 6, there is illustrated the first exemplary semiconductor structure of FIG. 5 after forming an antifuse dielectric material layer 24L having a dielectric constant that is greater than silicon dioxide. The antifuse dielectric material layer 24L is a continuous layer that is formed on the topmost surface of the hard mask 14, and along the faceted sidewall surfaces 22 and the bottommost surface of the crystallographic etched and recessed opening 16'.

Exemplary antifuse dielectric materials that can be used as the antifuse dielectric material layer 24L include silicon nitride, silicon oxynitride, hafnium oxide, hafnium silicon oxide, hafnium silicon oxynitride, aluminum oxide, zirconium oxide, or any combination of these materials.

The antifuse dielectric material layer 24L may be formed utilizing a deposition process such as, for example, atomic layer deposition (ALD), molecular layer deposition (MLD), chemical vapor deposition (CVD), or plasma enhanced chemical vapor deposition (PECVD. The antifuse dielectric material layer 24L follows the contour of the crystallographic etched and recessed opening 16' and does not entirely fill in the crystallographic etched and recessed opening 16'. In one embodiment, the antifuse dielectric material layer 24L has a thickness from 1 nm to 10 nm.

Figure 7:
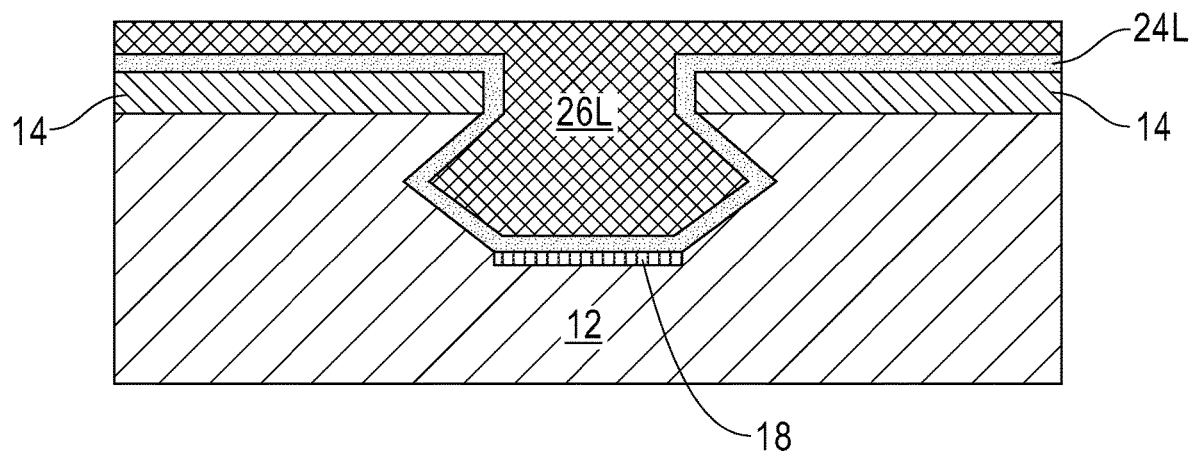
FIG. 7 is a cross sectional view of the first exemplary semiconductor structure of FIG. 6 after forming a metal or metal alloy layer on a physically exposed surface of the antifuse dielectric material layer.

Referring now to FIG. 7, there is illustrated the first exemplary semiconductor structure of FIG. 6 after forming a metal or metal alloy layer 26L on a physically exposed surface of the antifuse dielectric material layer 24L. The metal or metal alloy layer 26L is a continuous layer that is formed on the entirety of the antifuse dielectric material layer 24L.

The metal or metal alloy layer 26L that is employed in the present application is composed of a metal-containing conductive material such as, for example, a conductive metal (such as, for example, tungsten), an alloy containing at least two conductive metals, a conductive metal nitride (such as, for example, tungsten nitride, or titanium nitride) or a multilayered combination thereof. The metal or metal alloy layer 26L may be formed utilizing a deposition process including, but not limited to, atomic layer deposition (ALD), chemical vapor deposition (CVD) or plasma enhanced chemical vapor deposition (PECVD). The metal or metal alloy layer 26L may include an overburden upper portion that is formed outside the crystallographic etched and recessed opening 16' and above the topmost surface of the doped semiconductor substrate 12.

Figure 8:
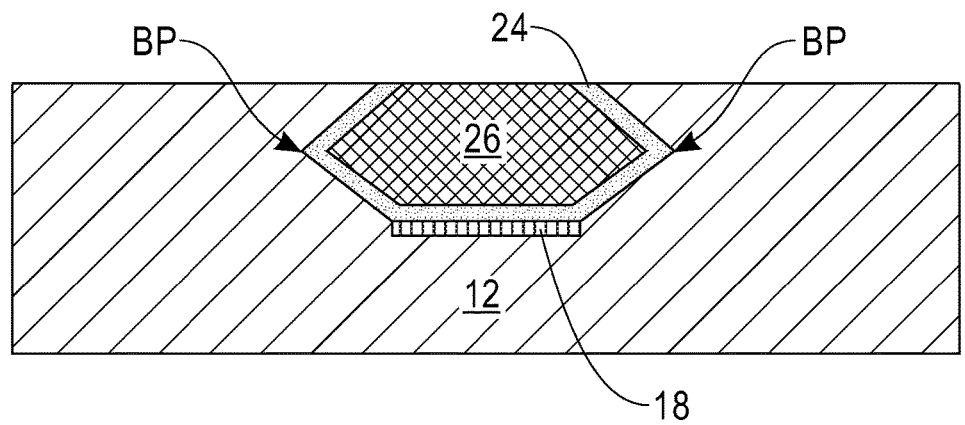
FIG. 8 is a cross sectional view of the first exemplary semiconductor structure of FIG. 7 after performing at least one material removal process.

Referring now to FIG. 8, there is illustrated the first exemplary semiconductor structure of FIG. 7 after performing at least one material removal process. In one embodiment, the at least one material removal process includes a planarization process such as, chemical mechanical polishing and/or grinding.

The at least one material removal process removes portions of the metal or metal alloy layer 26L, portions of the antifuse dielectric material layer 24L and each hard mask 14 from atop the doped semiconductor substrate 12, while maintaining a portion of the metal or metal alloy layer 26L, and a portion of the antifuse dielectric material layer 24L in the crystallographic etched and recessed opening 16'. The remaining metal or metal alloy layer 26L within the crystallographic etched and recessed opening 16' may be referred to herein as a metal or metal alloy structure 26 and the remaining portion of the antifuse dielectric material layer 24L within the crystallographic etched and recessed opening 16' may be referred to an antifuse dielectric material liner 24.

An antifuse is formed that is embedded in a semiconductor substrate. The antifuse includes the metal or metal alloy structure 26 as a first conductive region and the doped semiconductor portion of the substrate that is located adjacent the crystallographic etched and recessed opening 16' as a second conductive region. The two conductive regions of the antifuse are separated by the antifuse dielectric material liner 24. In this embodiment, the antifuse has two breakdown points (BP) that are present at sharp corners that are present along the faceted sidewall surfaces 22 of the crystallographic etched and recessed opening 16'. The antifuse has reduced breakdown voltage due to field enhancement and low resistance after being blown due to large contact area.

At this point of the present application, metal or metal alloy structure 26 and the antifuse dielectric material liner 24 have topmost surfaces that are coplanar with each other as well as being coplanar with a topmost surface of the doped semiconductor substrate 12.

Semiconductor devices including, for example, FinFET or vertical transistors may now be formed upon, and within the doped semiconductor substrate utilizing conventional techniques well known in the art.

Figure 9:
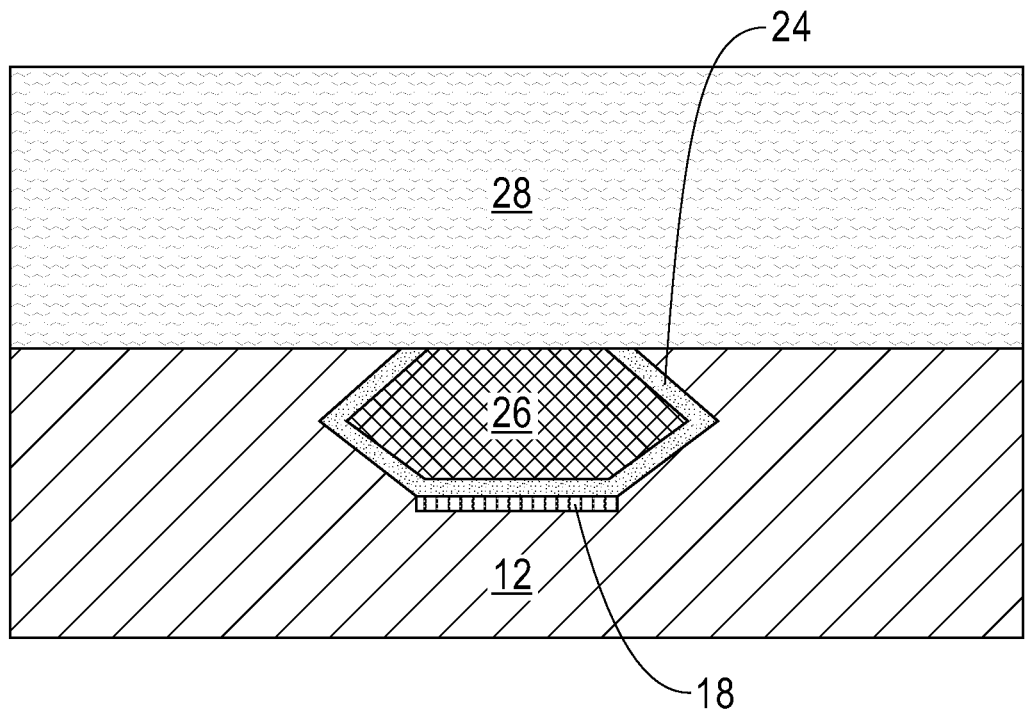
FIG. 9 is a cross sectional view of the first exemplary semiconductor structure of FIG. 8 after forming a middle-of-the-line (MOL) dielectric material.

Referring now to FIG. 9, there is illustrated the first exemplary semiconductor structure of FIG. 8 after forming a middle-of-the-line (MOL) dielectric material 28. The MOL dielectric material 28 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 28. The use of a self-planarizing dielectric material as the MOL dielectric material 28 may avoid the need to perform a subsequent planarizing step.

In one embodiment, the MOL dielectric material 28 can be formed utilizing a deposition process including, for example, chemical vapor deposition (CVD), plasma enhanced chemical vapor deposition (PECVD), evaporation or spin-on coating. In some embodiments, a planarization process and/or an etch back process follows the deposition of the MOL dielectric material 28. The MOL dielectric material 28 that can be employed in the present application may vary depending on the type of material employed as well as the method that was employed in forming the same. In one embodiment, the MOL dielectric material 28 has a thickness from 30 nm to 150 nm. Other thicknesses that are greater or lesser than the range provided above can also be used for the MOL dielectric material 28.

Figure 10:
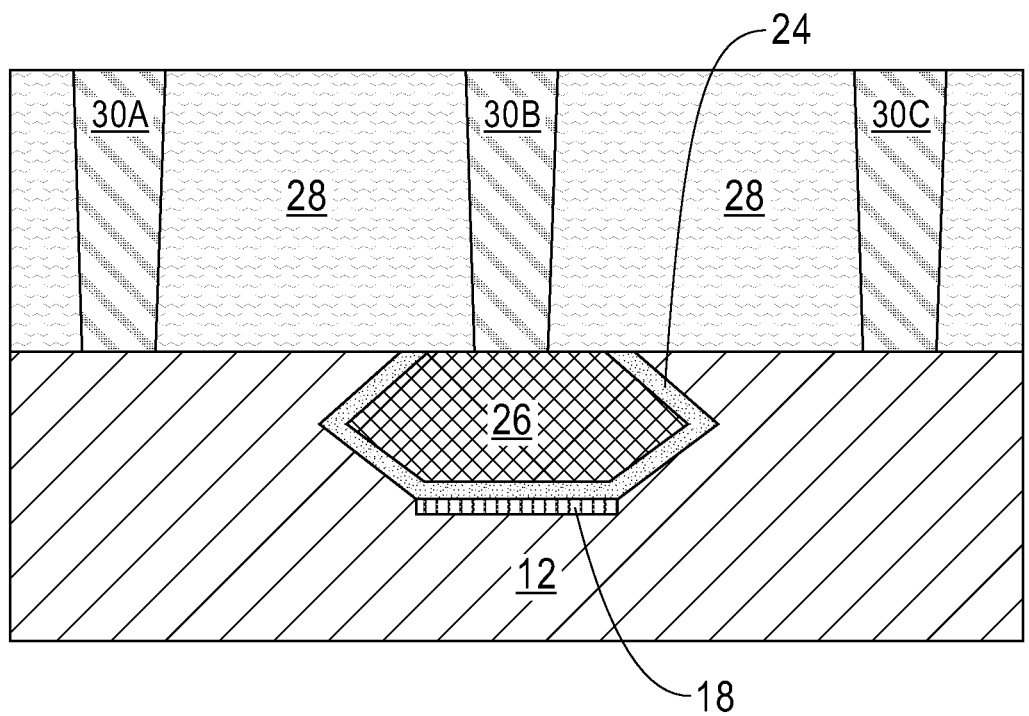
FIG. 10 is a cross sectional view of the first exemplary semiconductor structure of FIG. 9 after forming contact structures within the MOL dielectric material.

Referring now to FIG. 10, there is illustrated the first exemplary semiconductor structure of FIG. 9 after forming contact structures 30A, 30B, and 30C within the MOL dielectric material 28. As is shown, each contact structure 30A, 30B, and 30C has a topmost surface that is coplanar with a topmost surface of the MOL dielectric material 28. In the present application, contact structure 30B contacts a topmost surface of the metal or metal structure 26, contact structure 30A contacts the doped semiconductor material portion of the doped semiconductor substrate 12 located on one side of the metal or metal structure 26, and contact structure 30C contacts the doped semiconductor material portion of the doped semiconductor substrate 12 located on another side of the metal or metal structure 26.

Each contact structure 30A, 30B, and 30C can be formed by first providing contact openings within the MOL dielectric material 28. The contact openings can be formed by lithography and etching. One of the contact openings physically exposes a topmost surface of the metal or metal alloy structure 26, while two of the contact openings physically expose a topmost surface of the doped semiconductor substrate 12. Next, the contact openings can be filled with a contact metal or metal alloy and thereafter a planarization process may be used to provide the contact structures 30A, 30B, 30C. The contact metal or metal alloy used in providing the contact structures 30A, 30B, 30C is typically composed of a different metal or metal alloy than the metal or metal alloy structure 26. In some embodiments, the contact metal or metal alloy that provides the contact structures 30A, 30B, 30C may include copper, tungsten, cobalt or alloys thereof. In some embodiments, the contact openings and thus the contact structures 30A, 30B, 30C have tapered sidewalls as is shown in FIG. 10.

Figure 11:
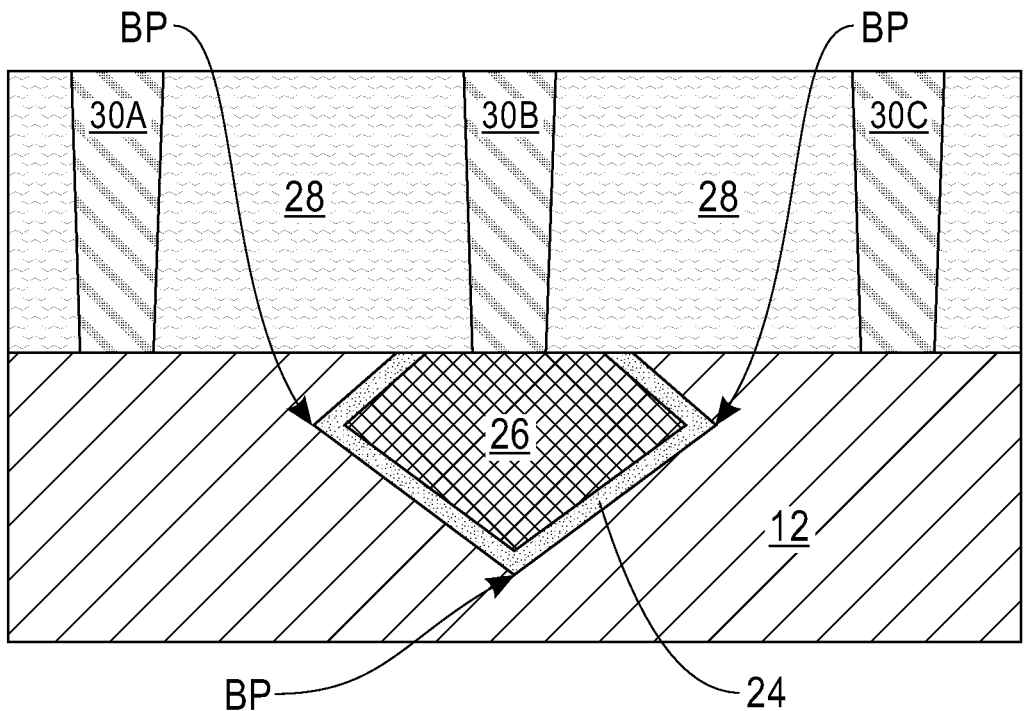
FIG. 11 is a cross view of a second exemplary semiconductor structure that can be derived from the first exemplary semiconductor structure.

Referring now to FIG. 11, there is illustrated a second exemplary semiconductor structure that can be derived from the first exemplary semiconductor structure. The second exemplary semiconductor structure can be formed by first providing the doped semiconductor substrate 12 shown in FIG. 3. Next, the crystallographic etch described above is performed without forming the etch stop region. In this embodiment, a diamond shaped recessed opening is formed into the doped semiconductor substrate 12; the diamond shaped opening has non-vertical sidewalls and a non-horizontal bottom wall. Next, the antifuse dielectric material liner 24 and the metal or metal alloy structure 26 of the antifuse is formed as described above, and thereafter a MOL dielectric 28 containing contact structures 30A, 30B and 30C are formed. In this embodiment, the antifuse has three breakdown points (BP) that are present at each sharp corner that is provided by the crystallographic etch. The antifuse has reduced breakdown voltage due to field enhancement and low resistance after being blown due to large contact area.

Figure 12:
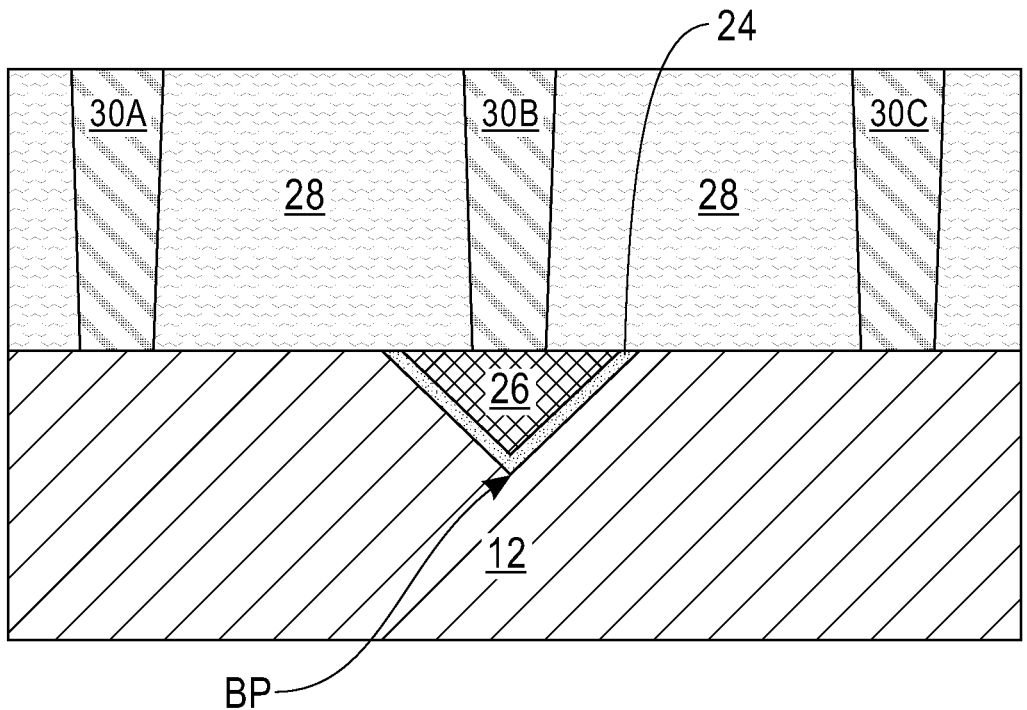
FIG. 12 is a cross view of a third exemplary semiconductor structure that can be derived from the first exemplary semiconductor structure.

Referring now to FIG. 12, there is illustrated a third exemplary semiconductor structure that can be derived from the first exemplary semiconductor structure. The third exemplary semiconductor structure can be formed by first providing the doped semiconductor substrate 12 shown in FIG. 2. Next, a hard mask layer is formed on the doped semiconductor substrate 12 and then the hard mask layer is patterned by lithography and etching to provide a patterned hard mask (i.e., hard mask 14) on the doped semiconductor substrate 12. Next, the crystallographic etch described above is performed without forming the recessed opening or etch stop region. In this embodiment, a triangular shaped opening is formed into the doped semiconductor substrate 12; the triangular shaped opening has a single tip that is located beneath the topmost surface of the doped semiconductor substrate 12. Next, the antifuse dielectric material liner 24 and the metal or metal alloy structure 26 of the antifuse is formed as described above, and thereafter a MOL dielectric 28 containing contact structures 30A, 30B and 30C are formed. In this embodiment, the antifuse has a single breakdown point (BP) that is present at the sharp corner that is provided by the crystallographic etch. The antifuse has reduced breakdown voltage due to field enhancement and low resistance after being blown due to large contact area.

Figure 13:
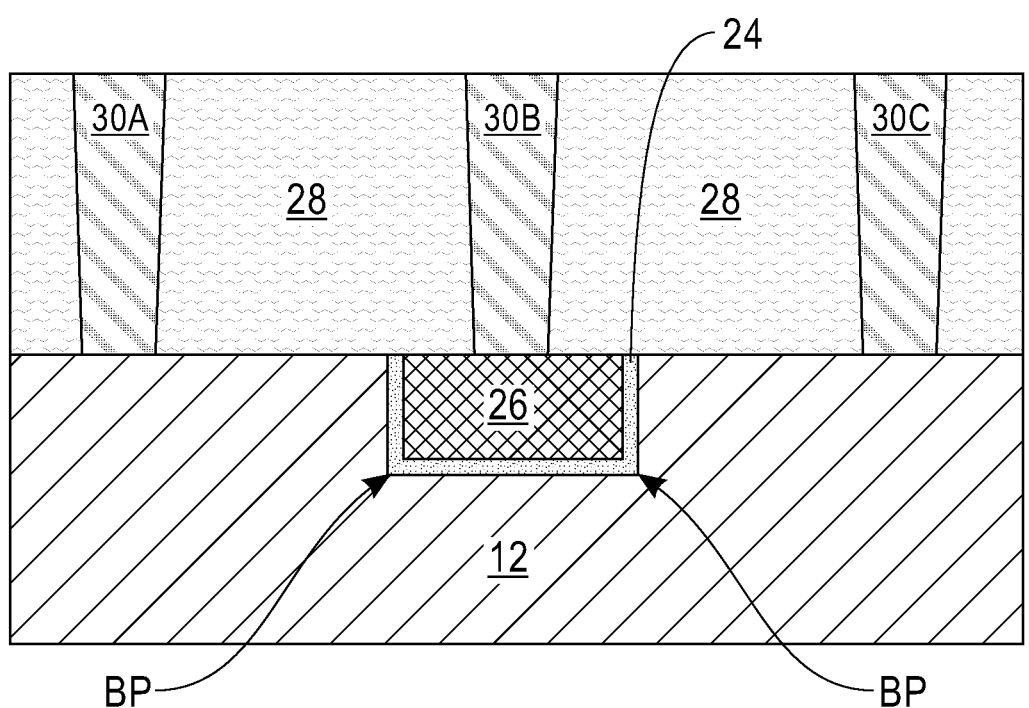
FIG. 13 is a cross view of a fourth exemplary semiconductor structure that can be derived from the first exemplary semiconductor structure.

Referring now to FIG. 13, there is illustrated a fourth exemplary semiconductor structure that can be derived from the first exemplary semiconductor structure. The fourth exemplary semiconductor structure can be formed by first providing the exemplary structure shown in FIG. 3. Next, the antifuse dielectric material liner 24 and the metal or metal alloy structure 26 are formed as described above, and thereafter a MOL dielectric 28 containing contact structures 30A, 30B and 30C are formed. In this embodiment, the antifuse has two breakdown points (BP) that are present at the sharp corners that is provided by patterning the substrate. The antifuse has reduced breakdown voltage due to field enhancement and low resistance after being blown due to large contact area.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an antifuse having faceted sidewalls that converge at a point and embedded in a semiconductor substrate, the antifuse comprising a metal or metal alloy structure present in a doped semiconductor material portion of the semiconductor substrate, wherein an antifuse dielectric material liner is present between the doped semiconductor material portion and the metal or metal alloy structure, and wherein each of the metal or metal alloy structure and the antifuse dielectric material liner has faceted sidewall surfaces, a shape selected from the group consisting of a sigma shape, a diamond shape and a triangular shape, and a topmost surface that is coplanar with each other and coplanar with a topmost surface of the semiconductor substrate.

2. The semiconductor structure of claim 1, further comprising a middle-of the-line (MOL) dielectric material located above the semiconductor substrate and containing a first contact structure contacting a topmost surface of the metal or metal alloy structure, a second contact structure contacting the doped semiconductor material portion located on one side of the metal or metal alloy structure, and a third contact structure contacting the doped semiconductor material portion located on another side of the metal or metal alloy structure.

3. The semiconductor structure of claim 1, wherein the doped semiconductor material portion is present in an upper portion of the semiconductor substrate.

4. The semiconductor structure of claim 1, wherein the doped semiconductor material portion has a dopant concentration from $1\times10^{20}$ atoms/cm$^3$ to $1\times10^{21}$ atoms/cm$^3$.

5. The semiconductor structure of claim 1, wherein the semiconductor substrate is a bulk semiconductor material.

6. A method of forming a semiconductor structure, the method comprising:
providing an opening having faceted sidewalls that converge at a point and within a doped semiconductor material portion of a semiconductor substrate; and
forming an antifuse dielectric material liner and a metal or metal alloy structure in the opening, wherein each of the antifuse dielectric material liner and the metal or metal alloy structure has faceted sidewall surfaces and a shape selected from the group consisting of a sigma shape, a diamond shape and a triangular shape.

7. The method of claim 6, wherein the providing the opening having the faceted sidewalls comprises:
forming a recessed opening in the doped semiconductor material portion of the semiconductor substrate; and
performing a crystallographic etch.

8. The method of claim 7, wherein an etch stop region is formed at a bottom of the recessed opening prior to the crystallographic etch.

9. The method of claim 6, wherein the providing the opening having the faceted sidewalls comprises:
performing a crystallographic etch on the doped semiconductor material portion of the semiconductor substrate.

10. The method of claim 6, further comprising forming a middle-of the-line (MOL) dielectric material located atop the semiconductor substrate, wherein the MOL dielectric material contains a first contact structure contacting a topmost surface of the metal or metal alloy structure, a second contact structure contacting the doped semiconductor material portion located on one side of the metal or metal alloy structure, and a third contact structure contacting the doped semiconductor material portion located on another side of the metal or metal alloy structure.

11. The method of claim 6, wherein the forming the antifuse dielectric material liner and the metal or metal alloy structure comprises:
forming an antifuse dielectric material layer;
forming a metal or metal alloy layer on the antifuse dielectric material layer; and
performing one or more material removal processes to remove portions of the metal or metal alloy layer and the antifuse dielectric material layer from a topmost surface of the semiconductor substrate.

12. A semiconductor structure comprising:
an antifuse having a bottom wall that converges at a point and embedded in a semiconductor substrate, the antifuse comprising a metal or metal alloy structure present in a doped semiconductor material portion of the semiconductor substrate, wherein an antifuse dielectric material liner is present between the doped semiconductor material portion and the metal or metal alloy structure, and wherein each of the metal or metal alloy structure and the antifuse dielectric material liner has a bottom wall surface, a shape selected from the group consisting of a diamond shape and a triangular shape, and a topmost surface that is coplanar with each other and coplanar with a topmost surface of the semiconductor substrate.

* * * * *